United States Patent
Satoh et al.

(10) Patent No.: US 7,557,357 B2
(45) Date of Patent: Jul. 7, 2009

(54) D/A CONVERSION DEVICE AND METHOD AND CHARGED PARTICLE BEAM EXPOSURE APPARATUS AND METHOD

(75) Inventors: Takamasa Satoh, Tokyo (JP); Koichi Hidaka, Nakai-machi (JP); Ryozo Yoshino, Nakai-machi (JP)

(73) Assignees: Advantest Corporation, Tokyo (JP); Hitachi Information & Communication Engineering, Ltd., Kanagawa (JP)

(*) Notice: Subject to any disclaimer, the term of this patent is extended or adjusted under 35 U.S.C. 154(b) by 264 days.

(21) Appl. No.: 11/729,898

(22) Filed: Mar. 28, 2007

(65) Prior Publication Data

US 2008/0054185 A1 Mar. 6, 2008

(30) Foreign Application Priority Data

Mar. 31, 2006 (JP) ............................. 2006-099222

(51) Int. Cl.
*H03M 1/10* (2006.01)
(52) U.S. Cl. .................... 250/398; 341/118; 341/120
(58) Field of Classification Search ................ 250/398, 250/492.2, 396 R; 341/118, 120
See application file for complete search history.

(56) References Cited

U.S. PATENT DOCUMENTS

| 6,946,983 B2 * | 9/2005 | Andersson et al. ........... 341/118 |
| 7,443,323 B2 * | 10/2008 | Rotchford et al. ........... 341/120 |

FOREIGN PATENT DOCUMENTS

JP 10-290162 10/1998

* cited by examiner

*Primary Examiner*—Kiet T Nguyen
(74) *Attorney, Agent, or Firm*—Muramatsu & Associates (57) ABSTRACT

The present invention is related to a D/A conversion device, it is provided with a first D/A conversion circuit which receives input of digital data composed of plural bits and outputs a corresponding electric output signal, and a second D/A conversion circuit which receives input of a correction code for the digital data and which outputs a corresponding electric correction signal, wherein the first and second D/A conversion circuits are connected to each other at their respective output terminals so that the electric output signal is corrected by the electric correction signal. The D/A conversion device comprises: storing means 105 for storing correction codes each for one bit of the digital data, the correction codes being determined in correlation with the first D/A conversion circuit 11; and calculating means 107 for performing serial entry and addition of the correction codes each for one bit of the digital data, and outputting a correction code for all bits of the digital data.

9 Claims, 10 Drawing Sheets

| Bit | Correction Code |
|---|---|
| $2^0$ | 0100 0010 0111 0010 |
| $2^1$ | 1001 0100 1101 1001 |
| $2^2$ | 0010 1111 0110 1000 |
| $2^3$ | 1101 0011 1001 0010 |
| $2^4$ | 0110 1000 0100 1001 |
| $2^5$ | 0010 0001 1001 0001 |
| $2^6$ | 0000 0110 0010 1110 |
| $2^7$ | 0000 1100 0000 0010 |
| $2^8$ | 0110 0011 0101 0011 |
| $2^9$ | 0001 0000 1001 0101 |
| $2^{10}$ | 0110 0011 1110 0110 |
| $2^{11}$ | 0100 1010 0101 0100 |
| $2^{12}$ | 1010 1110 0110 0011 |
| $2^{13}$ | 0111 1000 0100 0001 |
| $2^{14}$ | 1001 0011 0110 0100 |
| $2^{15}$ | 1101 0001 1001 0111 |

| Combination of Bits | | Expanded Correction Code |
|---|---|---|
| $2^1$ | $2^0$ | |
| 0 | 0 | 0000 0000 0000 0000 |
| 0 | 1 | 0100 0010 0111 0010 |
| 1 | 0 | 1001 0100 1101 1001 |
| 1 | 1 | 1101 0111 0100 1011 |

| Combination of Bits | | Expanded Correction Code |
|---|---|---|
| $2^3$ | $2^2$ | |
| 0 | 0 | 0000 0000 0000 0000 |
| 0 | 1 | 0010 1111 0110 1000 |
| 1 | 0 | 1101 0011 1001 0010 |
| 1 | 1 | 0000 0010 1111 1010 |

| Combination of Bits | | Expanded Correction Code |
|---|---|---|
| $2^5$ | $2^4$ | |
| 0 | 0 | 0000 0000 0000 0000 |
| 0 | 1 | 0110 1000 0100 1001 |
| 1 | 0 | 0010 0001 1001 0001 |
| 1 | 1 | 1000 1001 1101 1010 |

| Combination of Bits | | Expanded Correction Code |
|---|---|---|
| $2^7$ | $2^6$ | |
| 0 | 0 | 0000 0000 0000 0000 |
| 0 | 1 | 0000 0110 0011 1110 |
| 1 | 0 | 0000 1100 0000 0010 |
| 1 | 1 | 0001 0010 0100 0000 |

| Combination of Bits | | Expanded Correction Code |
|---|---|---|
| $2^9$ | $2^8$ | |
| 0 | 0 | 0000 0000 0000 0000 |
| 0 | 1 | 0110 0011 0101 0011 |
| 1 | 0 | 0001 0000 1001 0101 |
| 1 | 1 | 0111 0011 1110 1000 |

| Combination of Bits | | Expanded Correction Code |
|---|---|---|
| $2^{11}$ | $2^{10}$ | |
| 0 | 0 | 0000 0000 0000 0000 |
| 0 | 1 | 0110 0011 1110 0110 |
| 1 | 0 | 0100 1010 0101 0100 |
| 1 | 1 | 1010 1110 0011 1010 |

| Combination of Bits | | Expanded Correction Code |
|---|---|---|
| $2^{13}$ | $2^{12}$ | |
| 0 | 0 | 0000 0000 0000 0000 |
| 0 | 1 | 1010 1110 0110 0011 |
| 1 | 0 | 0111 1000 0100 0001 |
| 1 | 1 | 0100 1001 1101 1110 |

| Combination of Bits | | Expanded Correction Code |
|---|---|---|
| $2^{15}$ | $2^{14}$ | |
| 0 | 0 | 0000 0000 0000 0000 |
| 0 | 1 | 1001 0011 0110 0100 |
| 1 | 0 | 1101 0001 1001 0111 |
| 1 | 1 | 1110 0100 1111 1011 |

FIG. 10

D/A CONVERSION DEVICE AND METHOD AND CHARGED PARTICLE BEAM EXPOSURE APPARATUS AND METHOD

CROSS-REFERENCE TO RELATED APPLICATIONS

This application is based on and claims priority of Japanese Patent Application No. 2006-099222 filed on Mar. 31, 2006, the entire contents of which are incorporated herein by reference.

BACKGROUND OF THE INVENTION

1. Field of the Invention

The present invention relates to a D/A (digital-to-analog) conversion device and method which are applicable to a charged particle beam scanning deflector of a charged particle beam exposure apparatus and relates to a charged particle beam exposure apparatus and method.

2. Description of the Prior Art

A charged particle beam exposure apparatus requires higher accuracy of exposure position for purposes of finer patterning. The exposure apparatus also has to reduce exposure standby time and thereby improve exposure throughput since it scans a charged particle beam for patterning.

Incidentally, a D/A conversion circuit is interposed between a control circuit and a deflector for controlling the charged particle beam since a digital signal is used to control the scanning of the charged particle beam. However, the D/A conversion circuit is limited in performance. Deterioration in input-output linearity of the D/A conversion circuit often occurs and thus renders high-precision control difficult.

A D/A conversion device improved to overcome this difficulty is disclosed in Japanese Patent Application Laid-Open Publication No. Hei 10-290162.

A D/A conversion device 10A disclosed in FIG. 4 in Japanese Patent Application Laid-Open Publication No. Hei 10-290162 includes a first D/A conversion circuit 11 which receives input of 16-bit digital data and outputs a corresponding electric signal, a memory 13A which stores correction codes for all digital data that can be represented by 16 bits, and a second D/A conversion circuit 12 which receives input of the correction code for the digital data from the memory 13A and outputs a corresponding electric correction signal. Both the first and second D/A conversion circuits 11 and 12 are current output mode circuits. The first D/A conversion circuit 11 is configured of an R-2R ladder resistor network for the low-order 12 bits and a decoder for the high-order 4 bits, as shown in FIG. 14 of Japanese Patent Application Laid-Open Publication No. Hei 10-290162.

The D/A conversion device 10A is configured so that the electric output signal from the first D/A conversion circuit 11 is corrected by the electric correction signal from the second D/A conversion circuit 12.

The D/A conversion device performs operation as disclosed in FIG. 5 of Japanese Patent Application Laid-Open Publication No. Hei 10-290162.

The operation is prepared beforehand by inputting all digital data that can be represented by 16 bits to the first D/A conversion circuit 11, determining measured values corresponding to the digital data, and determining deviations from an ideal curve. The deviations are added, and their sum is stored in the memory 13A as a correction code for the digital data.

Then, digital data is inputted to the first D/A conversion circuit 11, which in turn outputs an electric output signal in analog form.

Also, the digital data is used to address the memory 13A that stores the correction codes, and the correction code corresponding to the digital data is read from the memory 13A.

Then, the read correction code is inputted to the second D/A conversion circuit 12, which in turn outputs an electric correction signal in analog form.

The electric correction signal is added to or subtracted from the electric output signal from the first D/A conversion circuit 11 to thereby correct the electric output signal.

However, the D/A conversion device mentioned above requires much time since time for access to the memory 13A is involved in each and every input of the correction code to the second D/A conversion circuit 12. The D/A conversion device also requires a memory having such a large capacity as can store correction codes for all digital data that can be represented by the configuration bits.

SUMMARY OF THE INVENTION

An object of the present invention is to provide a D/A conversion device and method and a charged particle beam exposure apparatus and method, which are capable of achieving both higher accuracy of exposure position and shorter exposure standby time without using a large-capacity memory.

According to one aspect of the present invention, there is provided a D/A conversion device including a first D/A conversion circuit which receives input of digital data composed of plural bits and which outputs a corresponding electric output signal, and a second D/A conversion circuit which receives input of a correction code for all bits of the digital data and which outputs a corresponding electric correction signal. In the D/A conversion device the first and second D/A conversion circuits are connected at their respective output terminals so that the electric output signal is corrected by the electric correction signal. Therefore, the D/A conversion device can improve the accuracy of the electric output signal.

In this case, correction codes each for one bit of the digital data, which are preobtained in correlation with the first D/A conversion circuit, are used to generate the correction code for all bits of the digital data. When bit data "1" is displayed by the passage of a current through a corresponding circuit in the first D/A conversion circuit, the correction codes each for one bit may be defined only in a situation where the bit data "1" is set.

Calculating means performs serial operation on all bits of the digital data by serially adding the correction codes each for one bit in real time in synchronization with the entry of the digital data, and then outputs the correction code for the digital data. Moreover, the correction code outputted by the calculating means is immediately inputted to the second D/A conversion circuit, which in turn outputs the electric correction signal. The electric output signal from the first D/A conversion circuit is immediately corrected by the electric correction signal, so that a desired corrected electric signal can be obtained.

With a circuit configuration capable of achieving the above functions, such a capacity as can store the correction codes each for one bit of the digital data and the results of calculations is sufficient for storing means, and therefore a small-capacity storage device such as a register can be used as the storing means. This enables high-speed operation.

According to another aspect of the present invention, expanded correction codes each for plural bits of the digital data, which are preobtained in correlation with the first D/A conversion circuit, are used to generate the correction code for the digital data. This makes it possible to perform serial operation on all bits of input serial data by serially calculating the expanded correction codes each for the plural bits, thus enabling a further reduction in the number of calculations. This enables higher-speed operation.

Also in this case, such a capacity as can store the expanded correction codes each for plural bits of the digital data and the results of calculations is sufficient for storing means, and therefore a small-capacity storage device such as a register can be used as the storing means. This enables high-speed operation.

The D/A conversion device of the present invention having the above configuration, as applied to a deflector for charged particle beam scan, can achieve both higher accuracy of exposure position and shorter exposure standby time without using a large-capacity memory.

DESCRIPTION OF THE PREFERRED EMBODIMENTS

Description will be given below with regard to preferred embodiments of the present invention with reference to the accompanying drawings.

First Embodiment

Figure 1:
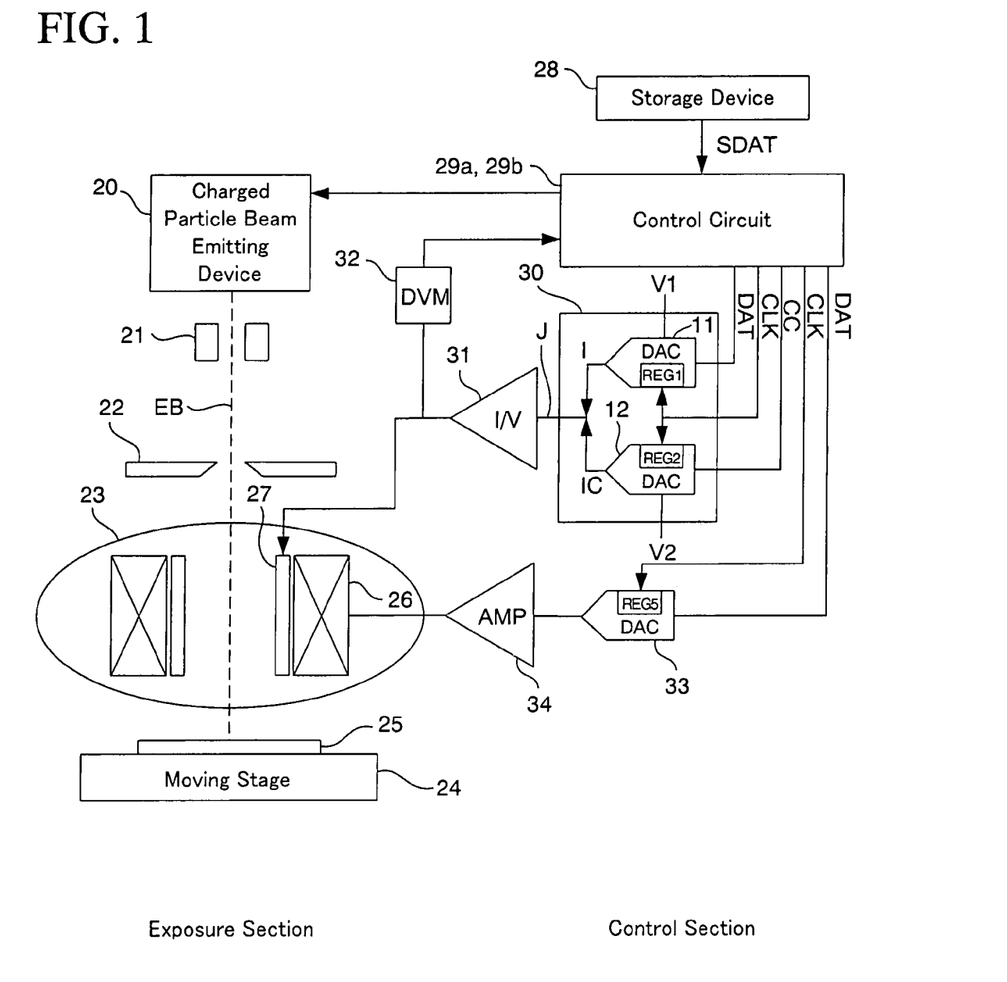
FIG. 1 is a schematic diagram showing a charged particle beam exposure apparatus according to a first embodiment of the present invention.

FIG. 1 is a schematic view showing the configuration of a charged particle beam exposure apparatus including a D/A conversion device according to a first embodiment of the present invention.

The charged particle beam exposure apparatus is configured of an exposure section and a control section as shown in FIG. 1.

The exposure section is configured of a charged particle beam emitting device 20, a blanking deflector 21, an aperture plate 22, an objective lens 23, and a moving stage 24.

A charged particle beam EB emitted from the charged particle beam emitting device 20 is applied through the blanking deflector 21, the aperture plate 22 and the objective lens 23 to a wafer 25 mounted on the moving stage 24. A cross section of the charged particle beam EB shaped by the charged particle beam emitting device 20 is reduced and projected onto the wafer 25. A main deflector 26 of an electromagnetic deflection type and an auxiliary deflector 27 of an electrostatic deflection type, which are disposed in the objective lens 23, are used to scan the charged particle beam EB over the wafer 25.

The control section is configured of a storage device 28, a control circuit 29a or 29b, a D/A converter 30 and a current-voltage converter 31 which control the auxiliary deflector 27 in accordance with a signal from the control circuit 29a or 29b, a digital volt meter (DVM) 32 which measures an output voltage from the current-voltage converter 31 and feeds back a measured value to the control circuit 29a or 29b, and a D/A converter 33 and an amplifier 34 which control the main deflector 26 in accordance with a signal from the control circuit 29a or 29b.

The control circuit 29a or 29b performs control based on pattern data read out from the storage device 28 so that the charged particle beam emitting device 20 operates to shape the cross section of the charged particle beam EB. The control circuit 29a or 29b also does likewise so that the D/A converter 30 and the current-voltage converter 31 operate to apply a voltage to the auxiliary deflector 27, and so that the D/A converter 33 and the amplifier 34 operate to feed a current to the main deflector 26. Thereby, an exposure position is determined on the wafer 25. The D/A converter 33 that controls the main deflector 26 has the same configuration as D/A conversion circuits disposed in the D/A converter 30 that controls the auxiliary deflector 27, and the D/A converter 33 is provided with a register REG5.

Description will now be given below with reference to the drawings with regard to detailed configurations of the control circuit 29a, the D/A converter 30 that controls the auxiliary deflector 27, the current-voltage converter 31, and the DVM 32.

Figure 2:
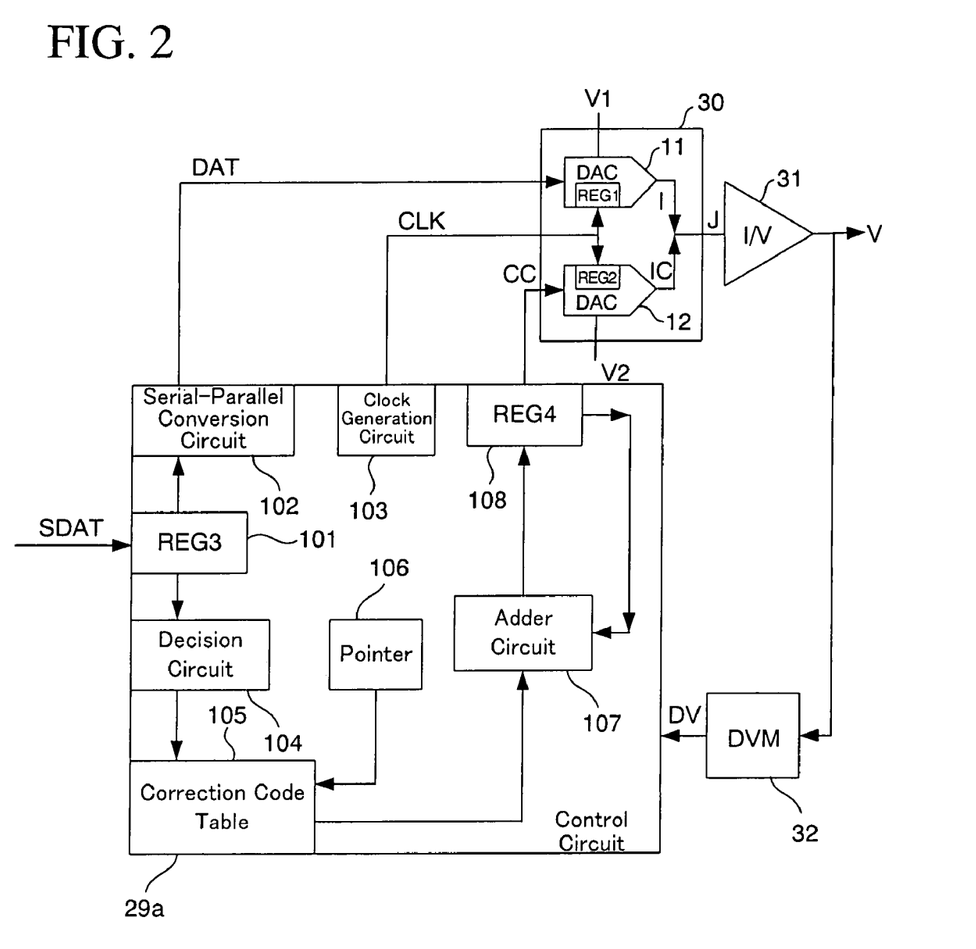
FIG. 2 is a schematic block diagram showing detailed configurations of a control circuit, a D/A converter, a current-voltage converter, and a DVM, which are included in the charged particle beam exposure apparatus according to the first embodiment of the present invention.

FIG. 2 is a block diagram showing relative connections of the control circuit 29a, the D/A converter 30 that controls the auxiliary deflector 27, the current-voltage converter 31, and the DVM 32.

As shown in FIG. 2, the control circuit 29a is configured mainly of a register (REG3) 101, a serial-parallel conversion circuit 102, a decision circuit 104, a correction code table 105, a pointer 106, an adder circuit 107, a register (REG4) 108, and a clock generator circuit 103. These circuits and the like, and the D/A converter 30 constitute the D/A conversion device.

The control circuit 29a is provided with, besides the above circuits, a circuit which outputs a deflection control code to the D/A converter 33 that controls the main deflector 26, and others, although they are not shown in FIG. 2.

The register (REG3) 101 receives input of plural bits of serial data (or digital data) SDAT as pattern data from the storage device 28. The serial-parallel conversion circuit 102 converts the serial data SDAT outputted by the register (REG3) 101 into parallel data (or digital data), which in turn is outputted to a first D/A conversion circuit 11.

Also, the decision circuit 104 determines whether each of the bits of the serial data SDAT outputted by the register (REG3) 101 is "0" or "1" in accordance with a signal from the pointer 106. The correction code table 105 stores correction codes CC corresponding to the respective bits, and outputs the correction codes CC corresponding to the bits judged as "i" by the decision circuit 104. The adder circuit 107 performs serial addition of the correction codes CC corresponding to the respective bits, and outputs their sum to the register (REG4) 108. The register (REG4) 108 serially stores sum data obtained by adding the correction codes CC, and in the end, stores the correction code CC obtained by adding the correction codes CC for every bit of the digital data.

Figure 10:
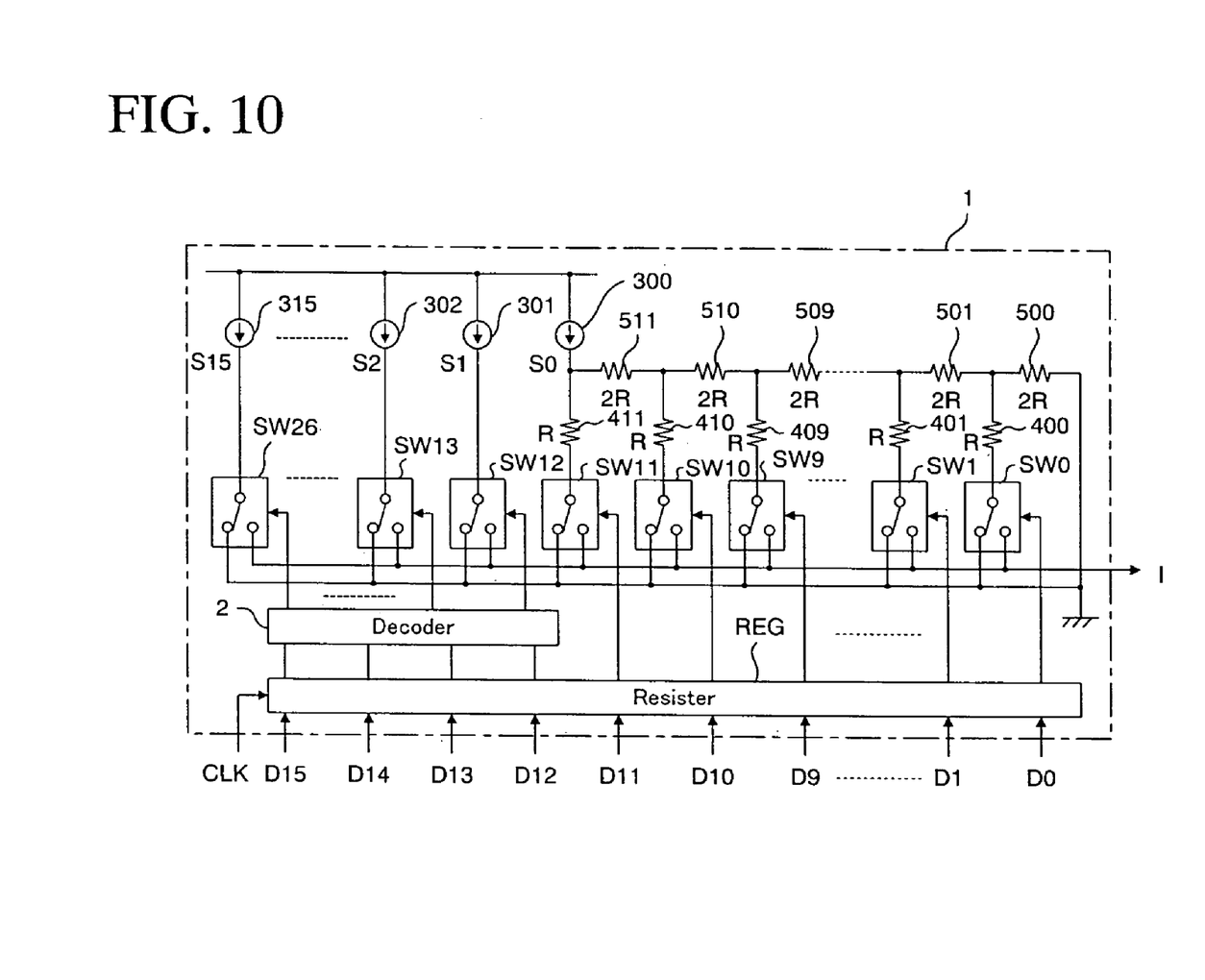
FIG. 10 is a circuit diagram showing a D/A conversion circuit included in the charged particle beam exposure apparatus according to the embodiment of the present invention.

The D/A converter 30 is configured of a first D/A conversion circuit 11 which converts the digital data outputted by the serial-parallel conversion circuit 102 into an electric output signal I, and a second D/A conversion circuit 12 which converts the correction code CC obtained by adding the correction codes CC for all bits of the digital data into an electric correction signal Ic. Both the first and second D/A conversion circuits 11 and 12 are current output mode circuits. The first D/A conversion circuit 11 is configured of an R-2R ladder resistor network for the low-order 12 bits D11 to D0 and a decoder for the high-order 4 bits D15 to D12, as shown in FIG. 10. The first D/A conversion circuit 11 has general circuit configuration and functions. Incidentally, the first D/A conversion circuit 11 is configured to adjust the values of resistances 400 to 411 and 500 to 511 and output currents from constant current sources 300 to 315 in accordance with the current output level I as employed in the present invention. The second D/A conversion circuit 12 also has the same circuit configuration and functions as the first D/A conversion circuit 11. Incidentally, the second D/A conversion circuit 12 is also configured to adjust the values of resistances and the constant current sources in accordance with the correction current value Ic.

The D/A conversion circuits 11 and 12 are provided with registers REG1 and REG2, respectively. As shown in FIG. 2, the registers REG1 and REG2 store the digital data and the correction codes CC, respectively, in accordance with a clock from the clock generator circuit 103 of the control circuit 29a.

Output terminals of the D/A conversion circuits 11 and 12 are connected to form a common output terminal, which is connected to an input terminal of the current-voltage converter 31. Under control of the clock from the clock generator circuit 103, the electric output signal I and the electric correction signal Ic are outputted to produce output of a current J whose errors are corrected, as shown in FIG. 2. Then, the current-voltage converter 31 converts the current J into a deflecting voltage, which in turn is outputted.

Figure 3:
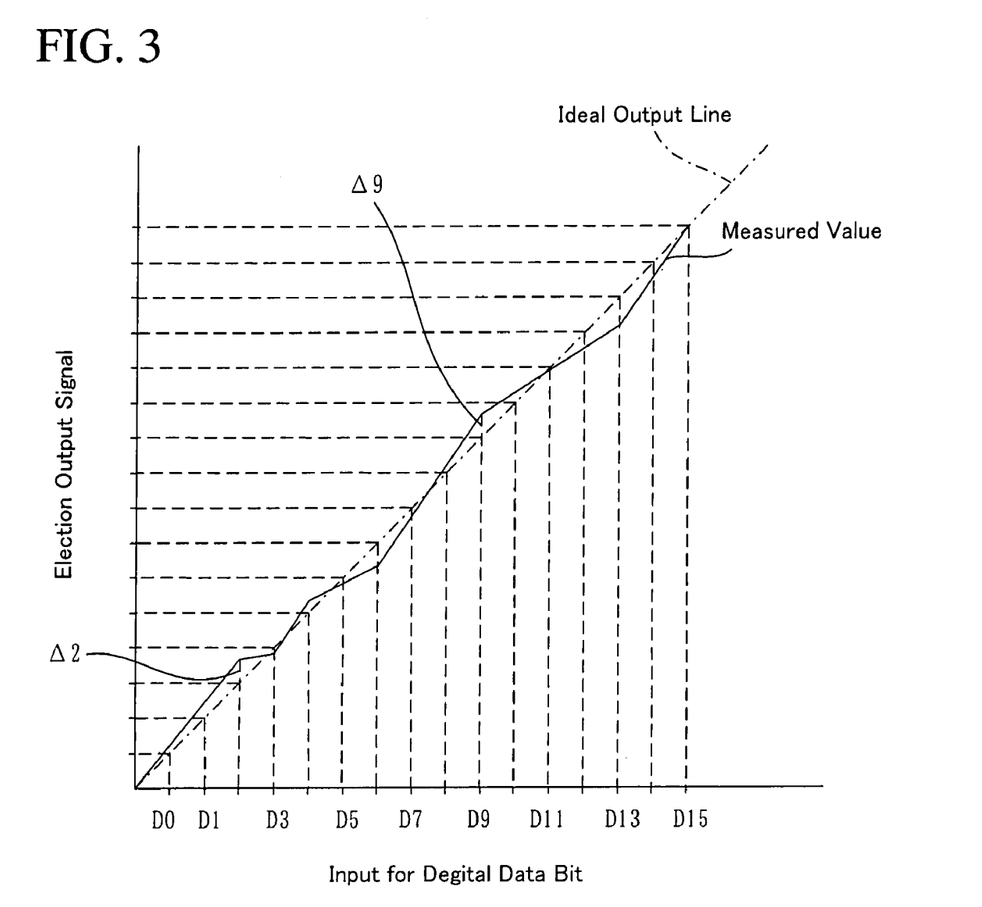
FIG. 3 is a graph showing input-output characteristics and an ideal output line of a first conversion circuit of the D/A converter included in the charged particle beam exposure apparatus according to the first embodiment of the present invention.

An output terminal of the current-voltage converter 31 is connected to an input terminal of the digital volt meter (DVM) 32, and an output terminal of the digital volt meter 32 is connected to a digital voltage (DV) input terminal of the control circuit 29a. This channel can be used to obtain the correction code. The correction code is obtained in a manner as given below. Specifically, the first D/A conversion circuit 11 converts digital data with bits (0 to n) sequentially set to "1" into electric output signals DV0 to DVn, respectively, which in turn are fed back to the control circuit 29a. In this case, variations from an ideal output line, in general, occur due to variations in the resistance values of the D/A conversion circuit and the supply currents therefrom. Deviations Δ0 to Δn (namely, voltages or currents) of the measured values of the electric output signals DV0 to DVn from the ideal output line are therefore determined as shown in FIG. 3. The deviations Δ0 to Δn are digitized to form correction codes, which in turn are prestored in the correction code table 105. The correction codes are given in FIG. 6. Incidentally, the ideal output line is set so that the sum of correction codes for data DAT with all bits set to "1," Δ0+Δ1+ ... +Δ10+Δ11+ ... +Δ26, is equal to 0.

Operation of the control section will now be described below with reference to FIGS. 4 and 5.

Figure 4:
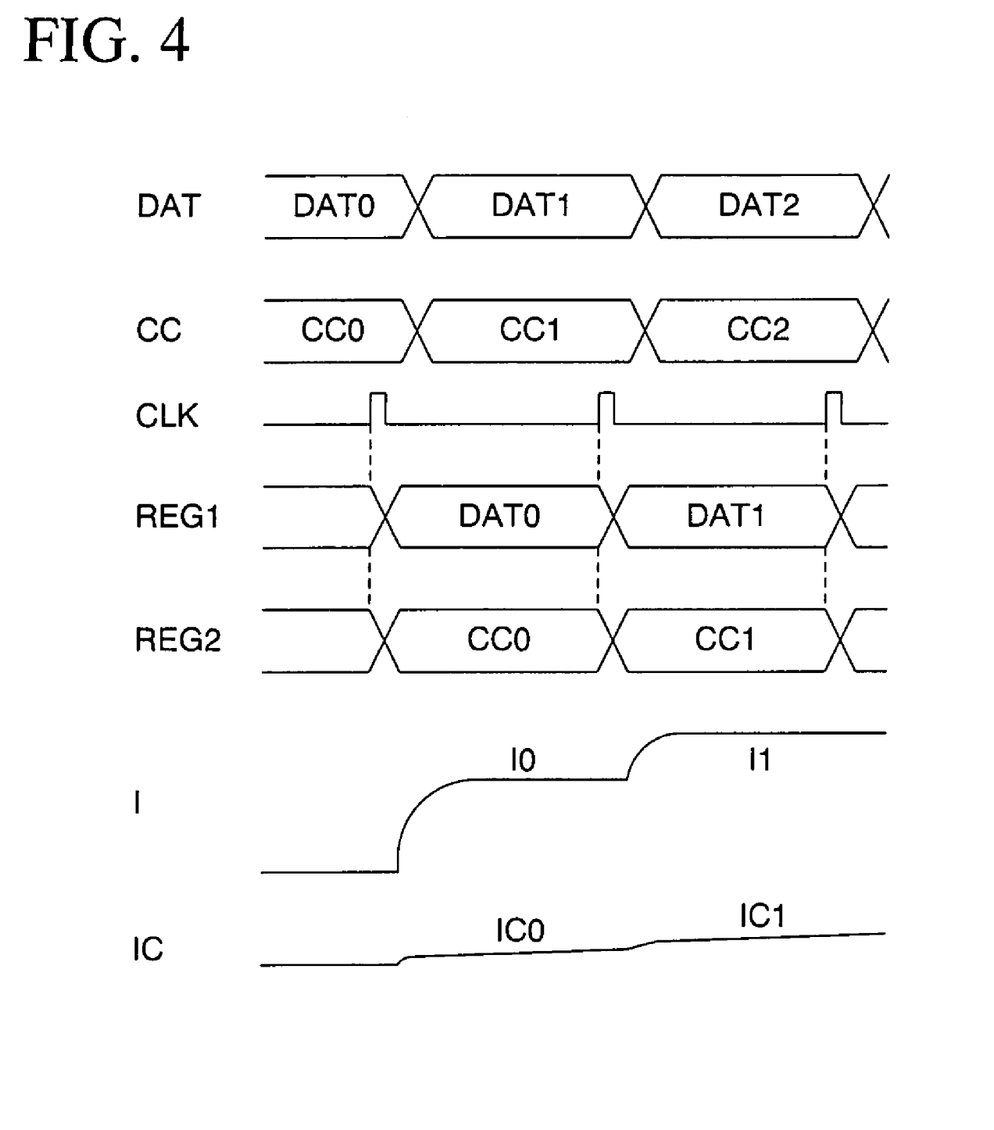
FIG. 4 is a timing chart showing the flows of signals indicative of digital data (DAT), correction codes (CC), clock pulses (CLK), data stored in a register (REG1), data stored in a register (REG2), output currents I, and correction currents Ic, which are produced in a control section included in the charged particle beam exposure apparatus according to the first embodiment of the present invention.

FIG. 4 is a timing chart showing the flows of signals indicative of digital data (DAT), correction codes (CC), clock pulses (CLK), data stored in the register (REG1), data stored in the register (REG2), output currents I, and correction currents Ic. FIG. 5 is a flowchart mainly showing a procedure for obtaining correction codes CC for digital data.

As shown in FIG. 4, first digital data is inputted to the control circuit 29a, the first digital data (DAT0) is held in the serial-parallel conversion circuit 102, and a first correction code (CC0) corresponding to the first digital data (DAT0) is held in the register (REG4). Under control of a first clock (CLK), the first digital data (DAT0) is held in the register (REG1) of the D/A conversion circuit 11, and the first correction code (CC0) is held in the register (REG2) of the D/A conversion circuit 12. Then, an output current I0 is outputted by the D/A conversion circuit 11, and a correction current Ic0 is outputted by the D/A conversion circuit 12. After that, the output current I0 is corrected by the correction current Ic0, and the corrected current (J) is converted into a voltage, which in turn is outputted to the auxiliary deflector.

Before a next clock (CLK), second digital data is inputted to the control circuit 29a, the second digital data (DAT1) is held in the serial-parallel conversion circuit 102, and a second correction code (CC1) corresponding to the second digital data (DAT1) is held in the register (REG4). Under control of a second clock (CLK), the second digital data (DAT1) is held in the register (REG1) of the D/A conversion circuit 11, and the second correction code (CC1) is held in the register (REG2) of the D/A conversion circuit 12. Then, an output current I1 is outputted by the D/A conversion circuit 11, and a correction current Ic1 is outputted by the D/A conversion circuit 12. After that, the output current I1 is corrected by the correction current Ic1, and the corrected current (J) is converted into a voltage, which in turn is outputted to the auxiliary deflector.

Thereafter, processing is performed on sequentially incoming digital data for deflection control to thereby sequentially convert the digital data into corresponding voltages. The auxiliary deflector is operated under control of the voltages.

Figure 5:
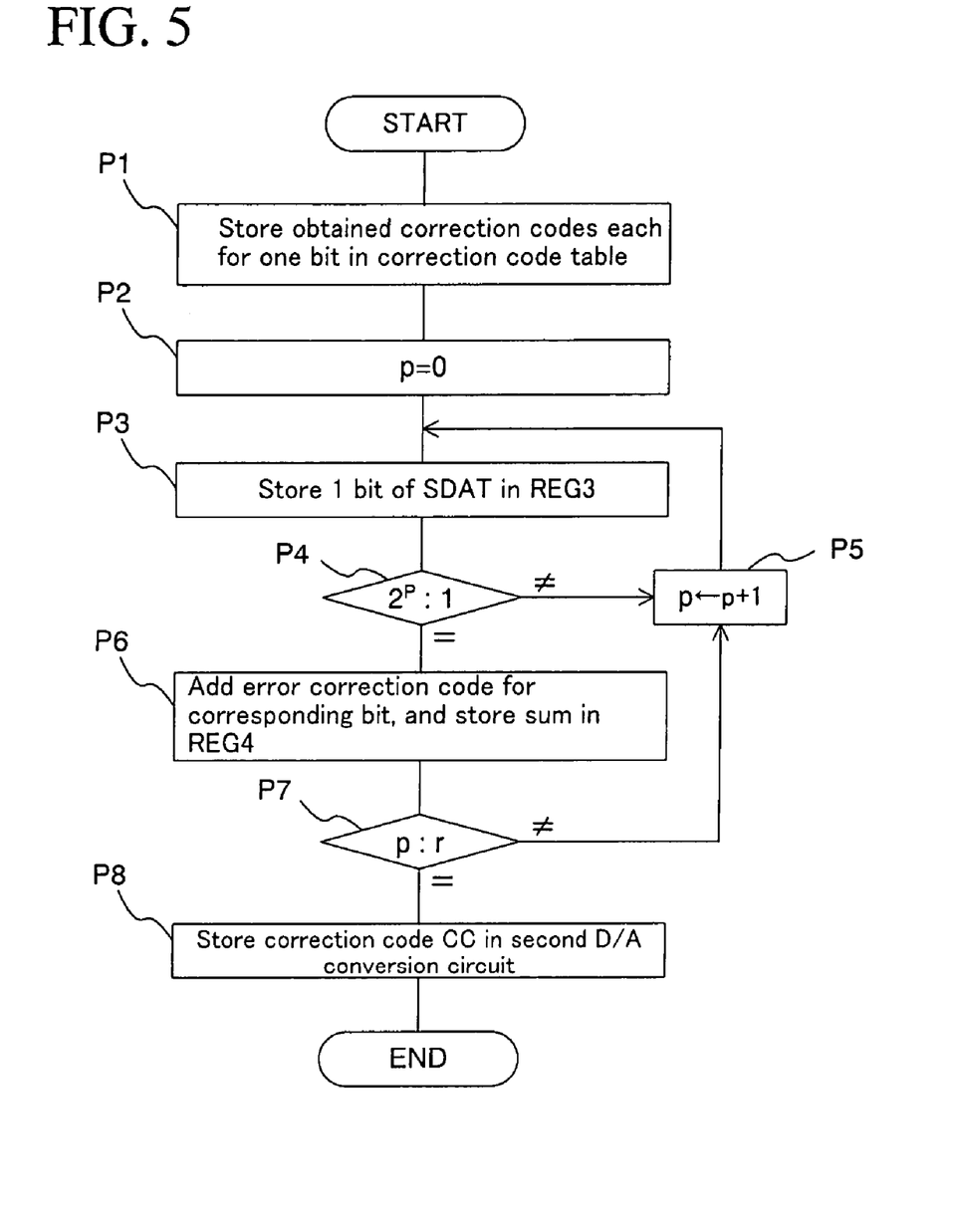
FIG. 5 is a flowchart showing operation of the control section included in the charged particle beam exposure apparatus according to the first embodiment of the present invention, particularly operation for generating a correction code CC based on error correcting codes each for one bit of digital data.

In this case, the correction code (CC) is generated within the control circuit 29a through the following steps P1 to P8 as shown in FIG. 5.

(P1) First, the correction codes derived from the deviations Δ0 to Δn of the measured values of the electric output signals DV0 to DVn from the ideal output line are stored in the correction code table 105.

(P2) Then, 0 is assigned to p, where p denotes the value of the pointer 106.

(P3) Then, 1 bit of the input serial data SDAT, corresponding to the value p of the pointer 106, is stored in the register (REG3) 101.

(P4) Then, the decision circuit 104 determines the bit value of the register (REG3) 101, pointed to by the pointer 106.

(P5) Then, when the bit value is "0," the variable p is incremented by 1, and the processing returns to step P3. When the bit value is "1," the processing proceeds to step P6.

Figure 6:
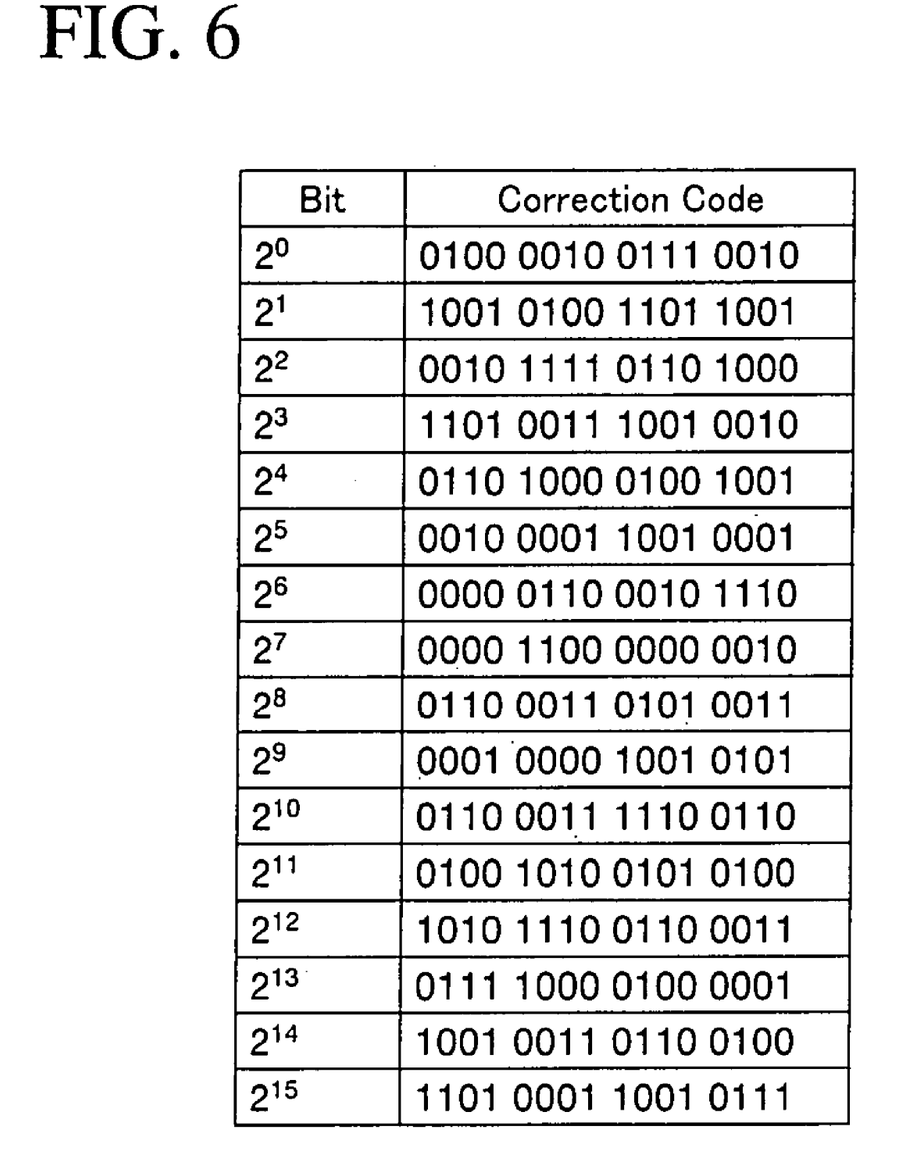
FIG. 6 is a table showing correction codes stored in a correction code table in the control circuit included in the charged particle beam exposure apparatus according to the first embodiment of the present invention.

(P6) Then, an error correcting code for the corresponding bit is read by referring to the error correcting code table 105 shown in FIG. 6, the error correcting code is added to the previous sum stored in the register (REG4) 108, and the resultant sum is stored in the register (REG4) 108.

(P7) Then, when p is less than r (p<r), the variable p is incremented by 1, and the processing returns to step P3. When p is equal to r (p=r), the processing proceeds to step P8. As employed herein, r denotes the number of bits of the data SDAT minus one. As employed in the first embodiment, r is equal to 15 (r=15).

(P8) Then, the value of the register (REG4) 108 is fed to the second D/A conversion circuit 12, as the correction code CC. In a case where SDAT="1011010011001011", for example, the error correcting codes corresponding to bits set to "1" are as follows.

Error correcting code for bit $2^{15}$ ... 1101000110010111
Error correcting code for bit $2^{13}$ ... 0111100001000001
Error correcting code for bit $2^{12}$ ... 1010111001100011
Error correcting code for bit $2^{10}$ ... 0110001111100110
Error correcting code for bit $2^{7}$ ... 0000110000000010
Error correcting code for bit $2^{6}$ ... 0000011000111110
Error correcting code for bit $2^{3}$ ... 1101001110010010
Error correcting code for bit $2^{1}$ ... 1001010011011001
Error correcting code for bit $2^{0}$ ... 0100001001110010

All these correcting codes are added, and an MSB (most significant bit) is determined. As a result, the correction code CC is "1000001100100111."

As described above, the control circuit 29a and the D/A converter 30 for use in the charged particle beam exposure apparatus according to the first embodiment of the present invention are configured so that the control circuit 29a is provided with the error correcting code table 105 that stores the error correcting codes corresponding to bits. This eliminates the need for storing the correction codes for all incoming digital data, thus eliminating the need for an expensive memory of wasteful access time. Moreover, the execution of steps P3 to P8 makes it possible to determine the correction code for input digital data both at high speed and in real time.

Second Embodiment

Description will now be given with reference to FIG. 7 with regard to the control circuit 29b, the D/A converter 30 that controls the auxiliary deflector 27, the current-voltage converter 31, and the DVM 32 for use in a charged particle beam exposure apparatus according to a second embodiment of the present invention.

Figure 7:
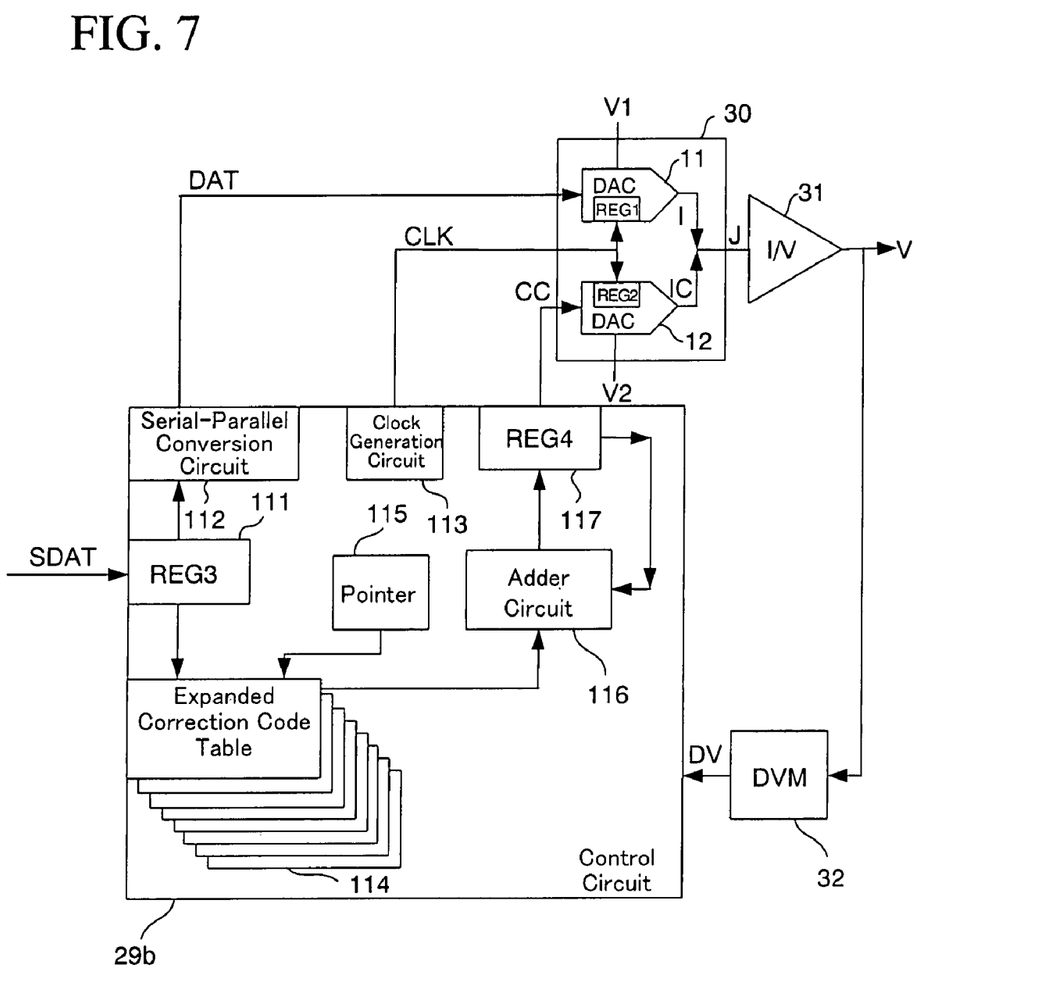
FIG. 7 is a schematic block diagram showing detailed configurations of a control circuit, a D/A converter, a current-voltage converter, and a DVM, which are included in a charged particle beam exposure apparatus according to a second embodiment of the present invention.

FIG. 7 is a block diagram showing the control circuit 29b, the D/A converter 30 that controls the auxiliary deflector 27, the current-voltage converter 31, and the DVM 32.

The control circuit 29b and others according to the second embodiment are different from the control circuit 29a and others according to the first embodiment shown in FIG. 2 in that the former uses an expanded correction code table 114 which stores correction codes each for two bits, in place of the error correcting code table 105 that stores the correction codes each for one bit. Thus, the control circuit 29b and others are different from the control circuit 29a and others in that the former obtains expanded correction codes each for 2 bits of input serial data. Incidentally, as shown in FIG. 7, circuits and others in the control circuit 29b and the D/A converter 30 constitute a D/A conversion device.

In this case, the expanded correction codes are obtained in a manner as given below. Specifically, the first D/A conversion circuit 11 converts digital data with bits (0 to n) sequentially set to "1" into electric output signals DV0 to DVn, respectively, which in turn are fed back to the control circuit 29b. In a manner as shown in FIG. 3, the deviations Δ0 to Δn of the measured values of the electric output signals DV0 to DVn from the ideal output line are determined and then digitized. The deviations Δ0 to Δn are each processed into a 16-bit digital data. Additions are performed based on the deviations Δ0 to Δn. Specifically, the deviations Δ0 to Δn are added for combinations of the low-order or high-order 2 bits, that is, ("0", "0"), ("0", "1"), ("1", "0"), and ("1", "1"). For example, when the combination of bit 1 and bit 0 is ("1", "0"), addition is performed to determine the deviation (Δ1) of bit 1 plus the deviation (zero) of bit 0. When the combination is ("1", "1"), addition is performed to determine the deviation (Δ1) of bit 1 plus the deviation (Δ0) of bit 0. Calculations are likewise performed for other combinations. The expanded correction codes are given in FIG. 9. The expanded correction codes determined in the manner as above mentioned are prestored in the expanded correction code table 114.

Figure 8:
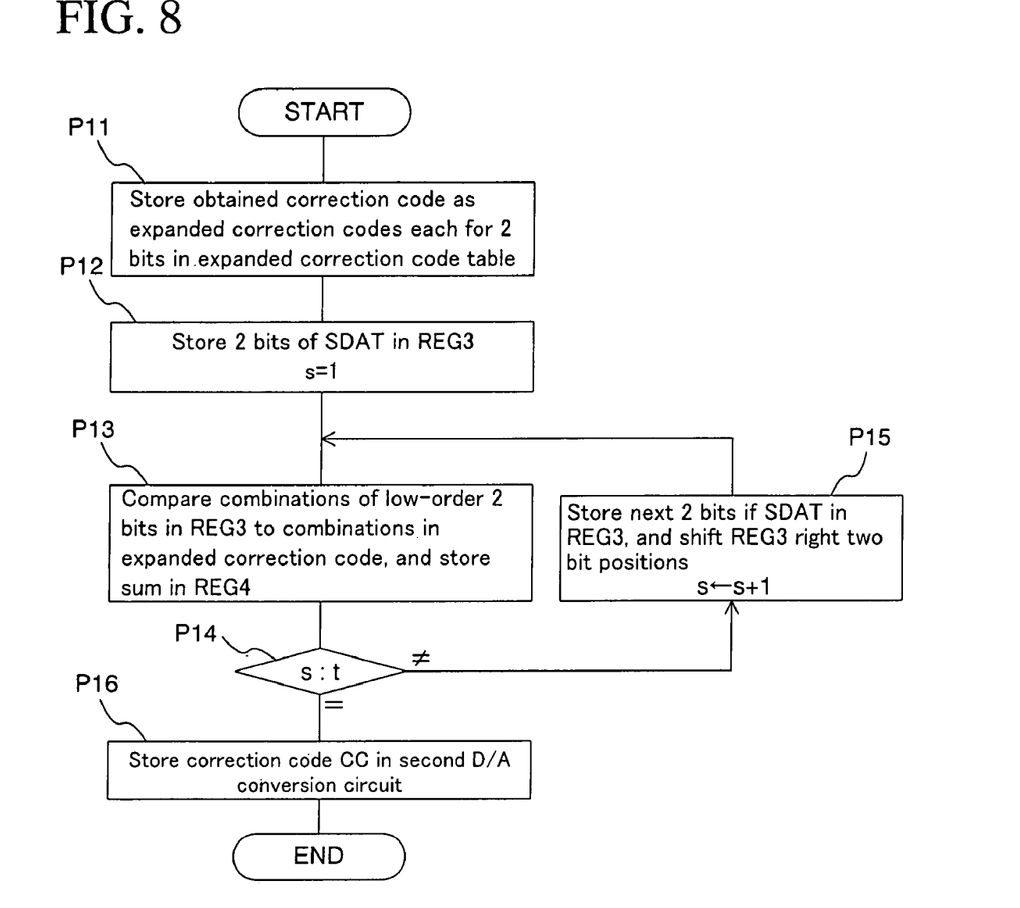
FIG. 8 is a flowchart showing operation of a control section included in the charged particle beam exposure apparatus according to the second embodiment of the present invention, particularly operation for generating a correction code CC based on expanded correction codes each for plural bits of digital data.

Description will now be given below with reference to FIG. 8 with regard to the operation of the control section and particularly to operation for generating the correction code CC based on the expanded correction codes. Since the general operation of the control section as a whole is the same as the operation shown in the timing chart of FIG. 4, description is omitted in this respect.

(P11) First, the expanded correction codes, each of which is obtained for every 2 bits, based on the deviations Δ0 to Δn of the measured values of the electric output signals DV0 to DVn from the ideal line, are stored in the expanded correction code table 114.

(P12) Then, the low-order 2 bits of input serial data SDAT are stored in a register (REG3) 111. 1 is assigned to s, where s denotes the value of a pointer 115.

(P13) Combinations of the 2 bits in the register (REG3) 111 are compared to combinations of the bits in the expanded correction code table 114 pointed to by the pointer 115, the corresponding expanded correction code is added to a register (REG4) 117, and the resultant sum is stored in the register (REG4) 117.

(P14) Then, the processing goes to step P15 when s is less than t (s<t), or the processing goes to step P16 when s is equal to t (s=t), where t denotes the number of bits of the data SDAT divided by the number of bits, the unit of which undergoes serial arithmetic operation. As employed in the second embodiment, t is equal to 8 (t=8).

(P15) Then, the next 2 bits of the serial data SDAT are stored in the register (REG3) 111, which in turn is shifted right two bit positions. Also, the variable s is incremented by 1, and the processing returns to step P13.

Figure 9:
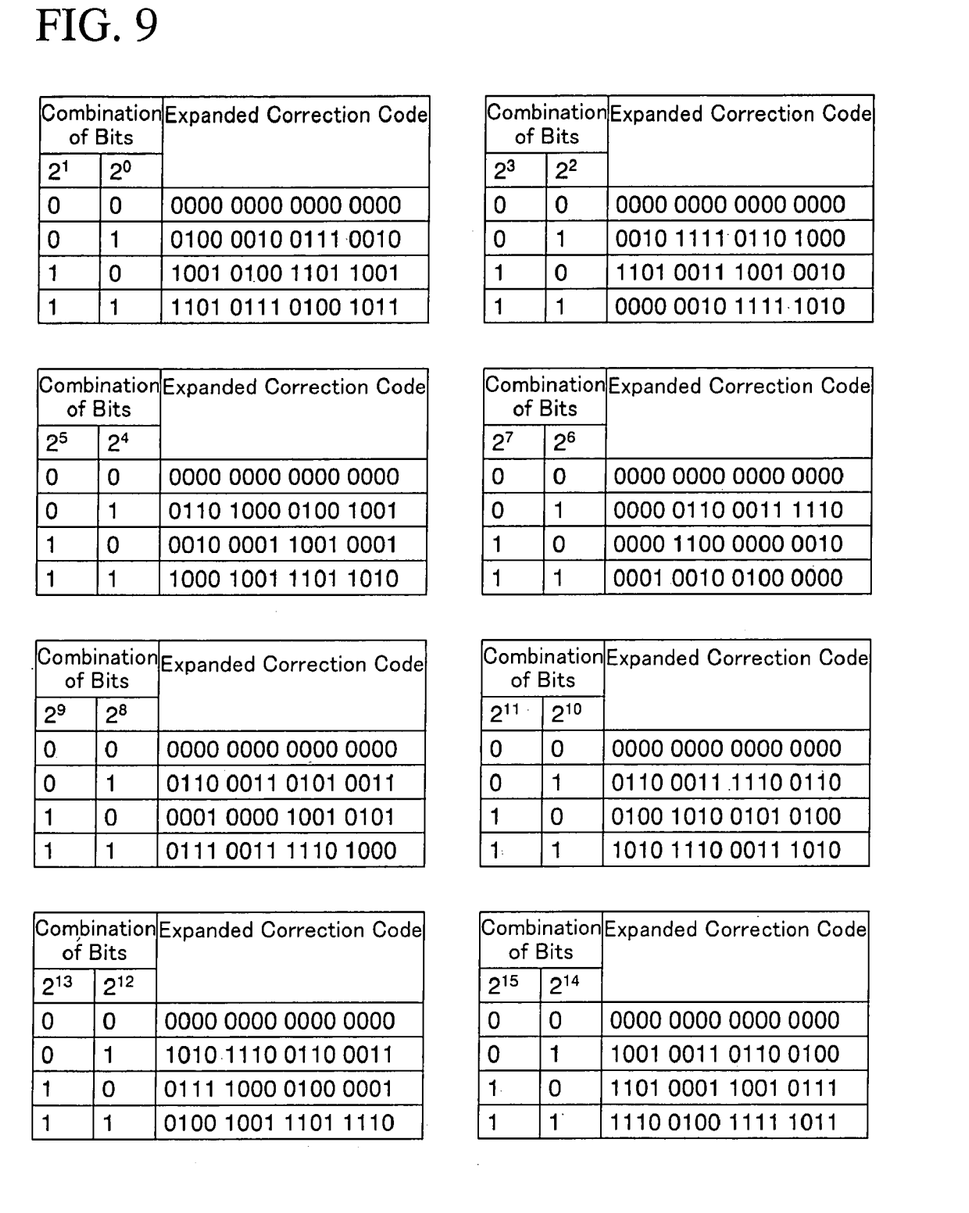
FIG. 9 is a table showing expanded correction codes stored in an expanded correction code table in the control circuit included in the charged particle beam exposure apparatus according to the second embodiment of the present invention.

(P16) Then, the value of the register (REG4) 117 as the correction code CC is fed to the second D/A conversion circuit 12. In a case where SDAT="0011001101010010", for example, the expanded correction codes each corresponding to 2 bits, referring to the expanded correction code table 114 shown in FIG. 9 are as follows.

Expanded correction code for bits $2^{15}$ and $2^{14}$ . . . 0000000000000000
Expanded correction code for bits $2^{13}$ and $2^{12}$ . . . 0100100111011110
Expanded correction code for bits $2^{11}$ and $2^{10}$ . . . 0000000000000000
Expanded correction code for bits $2^{9}$ and $2^{8}$ . . . 0111001111101000
Expanded correction code for bits $2^{7}$ and $2^{6}$ . . . 0000011000111110
Expanded correction code for bits $2^{5}$ and $2^{4}$ . . . 0110100001001001
Expanded correction code for bits $2^{3}$ and $2^{2}$ . . . 0000000000000000
Expanded correction code for bits $2^{1}$ and $2^{0}$ . . . 1001010011011001

All these expanded correction codes each for 2 bits are added, and an MSB is determined. As a result, the correction code CC for the digital data is "1110000010010011."

As described above, the control circuit 29b and the D/A converter 30 for use in the charged particle beam exposure apparatus according to the second embodiment of the present invention are configured so that the control circuit 29b is provided with the expanded correction code table 114 that stores the correction codes each corresponding to plural bits. As in the case of the first embodiment, this eliminates the need for holding the correction codes for all incoming digital data and thus eliminates the need for an expensive memory of wasteful access time. Moreover, the execution of steps P11 to P16 makes it possible to determine the correction code for input digital data both at high speed and in real time.

Moreover, serial arithmetic operation is sequentially performed on every plural bits of input serial data, so that the number of calculations can be reduced. This makes it possible to serially calculate the expanded correction codes each for the plural bits on all bits of the input serial data, thus enabling a further reduction in the number of calculations. This leads to higher operation speed.

Furthermore, the control circuit 29b and the D/A converter 30 having the above configuration, as applied to a deflector for charged particle beam scan, can achieve both higher accuracy of exposure position and shorter exposure standby time without using a large-capacity memory.

While this invention has been described in detail above in connection with certain exemplary embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of this invention.

For example, the first D/A conversion circuit 11, as employed in the above embodiments, is configured of the R-2R ladder resistor network for the low-order 12 bits and the decoder for the high-order 4 bits as shown in FIG. 10, but the D/A conversion circuit 11 is not limited to this. The first D/A conversion circuit 11 may be configured of the R-2R ladder resistor network or the decoder for all bits. The same goes for the second D/A conversion circuit 12.

What is claimed is:

1. A D/A conversion device including a first D/A conversion circuit which receives input of digital data composed of a plurality of bits and which outputs a corresponding electric output signal, and a second D/A conversion circuit which receives input of a correction code for the digital data and outputs a corresponding electric correction signal, in which the first and second D/A conversion circuits are connected to each other at their respective output terminals so that the electric output signal is corrected by the electric correction signal, the D/A conversion device comprising:
   storing means for storing correction codes each for one bit of the digital data, the correction codes being determined in correlation with the first D/A conversion circuit; and
   calculating means for performing serial entry and addition of the correction codes each for one bit of the digital data, and outputting a correction code for all bits of the digital data.

2. The D/A conversion device according to claim 1, comprising a decision circuit which determines whether bit data of the digital data is "0" or "1,"
   wherein the calculating means serially reads out and adds the correction codes for bits corresponding to the bit data "1," and outputs the correction code for all bits of the digital data.

3. A charged particle beam exposure apparatus for shaping a charged particle beam and irradiating an object to be exposed with the charged particle beam, comprising:
   a D/A conversion device configured as described in claim 1 where the D/A conversion device outputs an electric scan signal; and
   a charged particle beam scanning deflector connected to an output terminal of the D/A conversion device.

4. A D/A conversion method, comprising the steps of:
   (1) inputting digital data composed of a plurality of bits to a first D/A conversion circuit, and outputting a corresponding electric output signal;
   (2) storing correction codes each for one bit of the digital data, the correction codes being determined in correlation with the first D/A conversion circuit;
   (3) performing serial entry and addition of the correction codes each for one bit of the digital data, and outputting a correction code for all bits of the digital data;
   (4) inputting the correction code for all bits of the digital data to a second D/A conversion circuit, and outputting a corresponding electric correction signal; and
   (5) correcting the electric output signal by the electric correction signal.

5. The D/A conversion method according to claim 4, wherein when serial data corresponding to the number of bits of the digital data, with bits sequentially set to "1," is inputted to the first D/A conversion circuit, the correction codes each for one bit of the digital data are set as digital data Δk corresponding to a deviation $\Delta V_k$ from an ideal output line (where k represents bit).

6. A charged particle beam exposure method for shaping a charged particle beam and irradiating an object to be exposed with the charged particle beam, comprising the steps of:
   serially correcting the digital data and outputting an electric scan signal by a D/A conversion method comprised of the steps described in claim 4; and
   scanning the charged particle beam over the object to be exposed by the electric scan signal.

7. A D/A conversion device including a first D/A conversion circuit which receives input of digital data composed of a plurality of bits, and which outputs a corresponding electric output signal, and a second D/A conversion circuit which receives input of a correction code for the digital data and which outputs a corresponding electric correction signal, in which the first and second D/A conversion circuits are connected to each other at their respective output terminals so that the electric output signal is corrected by the electric correction signal, the D/A conversion device comprising:

storing means for storing expanded correction codes each for a plurality of bits of the digital data, the expanded correction codes being determined in correlation with the first D/A conversion circuit; and calculating means for performing serial entry and addition of the expanded correction codes each for the plurality of bits, and outputting a correction code for all bits of the digital data.

8. A D/A conversion method, comprising the steps of:
(1) inputting digital data composed of a plurality of bits to a first D/A conversion circuit, and outputting a corresponding electric output signal;
(2) storing expanded correction codes each for a plurality of bits of the digital data, the expanded correction codes being determined in correlation with the first D/A conversion circuit;
(3) performing serial entry and addition of the expanded correction codes each for the plurality of bits of the digital data, and outputting a correction code for all bits of the digital data;
(4) inputting the correction code for all bits of the digital data to a second D/A conversion circuit, and outputting a corresponding electric correction signal; and
(5) correcting the electric output signal by the electric correction signal.

9. The D/A conversion method according to claim 8, wherein when serial data corresponding to the number of bits of the digital data, with bits sequentially set to "1," is inputted to the first D/A conversion circuit, the expanded correction code is set as the sum (expressed as $\Sigma_{(k=i\sim j)}\Delta k$) of digital data $\Delta k$ corresponding to a deviation $\Delta V_k$ from an ideal output line (where k represents bit and i~j represents all bits belonging to a unit of plural bits).

* * * * *